(12) United States Patent
DeVries

(10) Patent No.: US 12,262,798 B1
(45) Date of Patent: Apr. 1, 2025

(54) ELECTROMAGNETICALLY SHIELDED DOOR GASKET FOR FABRIC ENCLOSURE

(71) Applicant: Faraday Defense Corporation, Kalamazoo, MI (US)

(72) Inventor: Jason R DeVries, Kalamazoo, MI (US)

(73) Assignee: Faraday Defense Corporation, Kalamazoo, MI (US)

(*) Notice: Subject to any disclaimer, the term of this patent is extended or adjusted under 35 U.S.C. 154(b) by 0 days.

(21) Appl. No.: 18/476,779

(22) Filed: Sep. 28, 2023

(51) Int. Cl.
*H05K 9/00* (2006.01)
*A44B 19/32* (2006.01)

(52) U.S. Cl.
CPC ............ *A44B 19/32* (2013.01); *H05K 9/0009* (2013.01); *H05K 9/0015* (2013.01)

(58) Field of Classification Search
CPC ............................ H05K 9/0009; H05K 9/0015
See application file for complete search history.

(56) References Cited

U.S. PATENT DOCUMENTS

| | | | | |
|---|---|---|---|---|
| 10,178,815 B1* | 1/2019 | Vieyra | ................. | A45C 5/02 |
| 10,939,595 B1* | 3/2021 | Abouhatsira | ........ | H05K 9/0001 |
| 11,871,551 B1* | 1/2024 | Zar | .................... | A41D 1/002 |
| 2009/0067150 A1* | 3/2009 | Ito | ...................... | H05K 9/0043 361/818 |
| 2012/0061134 A1* | 3/2012 | Kennedy | .............. | D02G 3/12 174/388 |
| 2014/0190841 A1* | 7/2014 | Nash | ................... | H05K 9/0045 206/37 |
| 2019/0124799 A1* | 4/2019 | Bodi | ...................... | E04H 6/42 |
| 2022/0015272 A1* | 1/2022 | Lim | ..................... | H05K 1/0203 |

* cited by examiner

*Primary Examiner* — Hung V Ngo
(74) *Attorney, Agent, or Firm* — Patents and Licensing LLC; Daniel W. Juffernbruch

(57) ABSTRACT

A first electromagnetic shielding fabric connects to first and third zipper tapes around an opening. A second electromagnetic shielding fabric connects to second and fourth zipper tapes around a door to fit the opening. The first, second, third and fourth zipper tapes each have a row of teeth that mesh pairs of the tapes. An elongated gasket is fixedly secured to the first electromagnetic shielding fabric and can be wrapped around the elongated gasket in a positon between the first and third zipper tapes. Another elongated gasket can be fixedly secured to the second electromagnetic shielding fabric and can be wrapped around the elongated gasket in a positon between the second zipper tape and the fourth zipper tape. Extra elongated gaskets can be fixedly secured with extra electromagnetic shielding fabric wrapped around the extra elongated gaskets. The various elongated gaskets can be compressible foam.

27 Claims, 13 Drawing Sheets

ELECTROMAGNETICALLY SHIELDED DOOR GASKET FOR FABRIC ENCLOSURE

BACKGROUND OF THE INVENTIONS

1. Technical Field

The present inventions relate to electromagnetic shielding fabric enclosures and, more particularly, relate to openings for electromagnetic shielding fabric enclosures.

2. Description of the Related Art

Electromagnetically shielded rooms and enclosures are known. Rigid doors for such rooms are known with copper spring seals and metal flanges.

Soft fabric enclosures and tents are flexible, lightweight, and easily stored, shipped, and deployed.

What is needed is an effective electromagnetically shielded opening for electromagnetic shielded fabric enclosures.

BRIEF DESCRIPTION OF THE DRAWINGS

The present inventions are illustrated by way of example and are not limited by the accompanying figures, in which like references indicate similar elements. Elements in the figures are illustrated for simplicity and clarity and have not necessarily been drawn to scale.

The details of the preferred embodiments will be more readily understood from the following detailed description when read in conjunction with the accompanying drawings wherein.

DETAILED DESCRIPTION OF THE PREFERRED EMBODIMENTS

Figure 1:
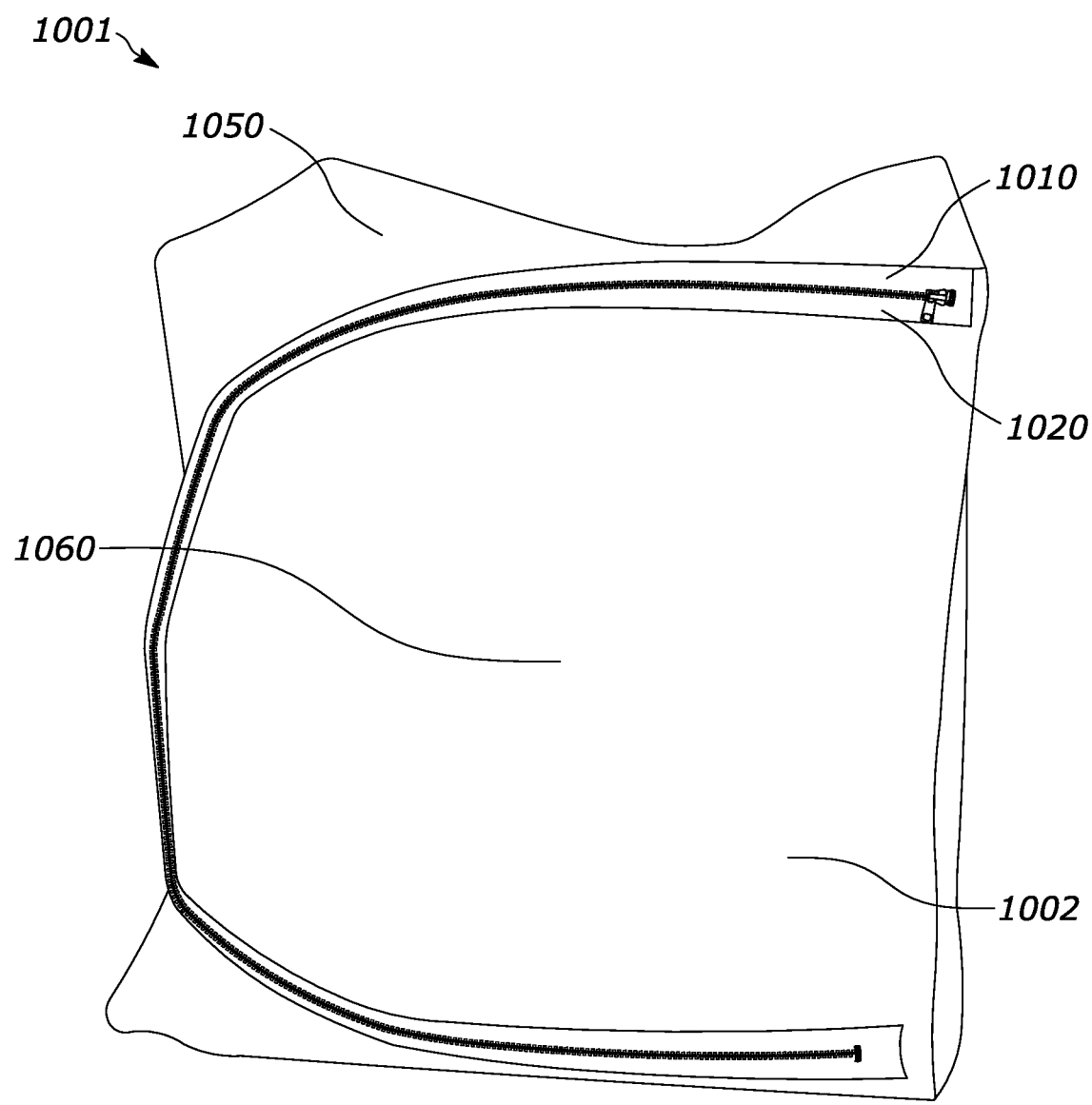
FIG. 1 illustrates a perspective view of an electromagnetically shielded enclosure with a closed zipper opening according to embodiments of the present inventions.

FIG. 1 illustrates a perspective view of an electromagnetically shielded enclosure 1001 with a closed zipper opening according to embodiments of the present inventions. A first electromagnetic shielding fabric 1050 is sewn to a first zipper tape 1010. A second electromagnetic shielding fabric 1060 is sewn to the second zipper tape 1020.

The electromagnetic shielding fabric used in the embodiments of the present inventions is preferably an EMF/RFID Shielding Nickel/Copper plated fabric. The base fabric can be polyester, cotton, or other fabric that is plated with a conductive mix of Copper and Nickel.

Figure 2:
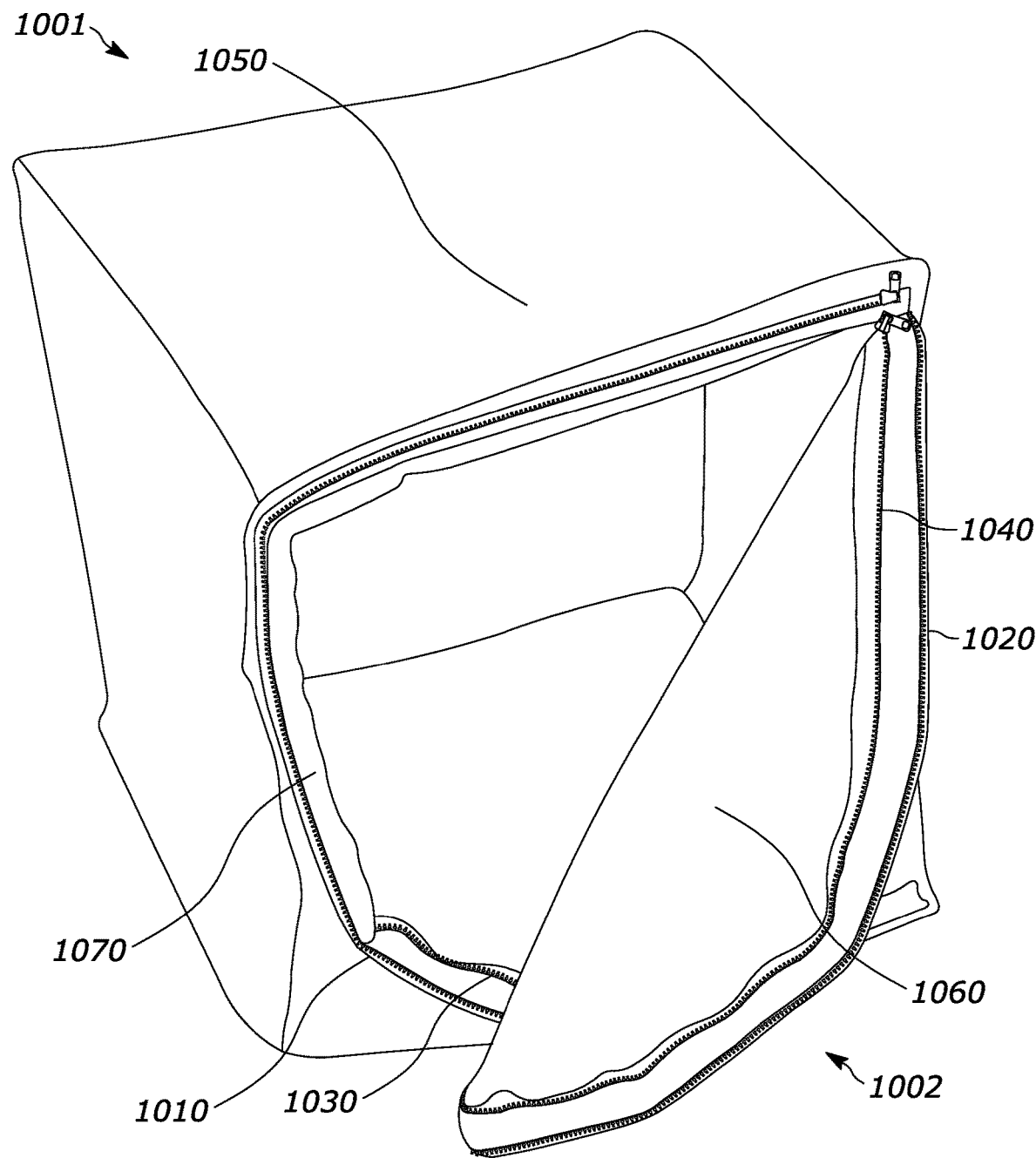
FIG. 2 illustrates a perspective view of an electromagnetically shielded enclosure with a closed zipper opening according to embodiments of the present inventions.

FIG. 2 illustrates a perspective view of an electromagnetically shielded enclosure 1001 with a closed zipper opening according to embodiments of the present inventions. A first electromagnetic shielding fabric 1050 is sewn to a first zipper tape 1010 and a third zipper tape 1030. A second electromagnetic shielding fabric 1060 is sewn to the second zipper tape 1020 and a fourth second zipper tape 1040. An elongated gasket 1070 is sewn to the first electromagnetic shielding fabric 1050 in a positon between the first zipper tape 1010 and a third zipper tape 1030. The elongated gasket 1070 can be made from a compressible foam core wrapped with a piece of electromagnetic shielding fabric. That wrapped piece of electromagnetic shielding fabric can be its own piece sewn to the first electromagnetic shielding fabric 1050. Alternatively, that wrapped piece of electromagnetic shielding fabric can be the same fabric as the first electromagnetic shielding fabric 1050 extended around the compressible foam core. A door or window 1002 to electromagnetically seal the electromagnetically shielded enclosure 1001 can be resembled by the second electromagnetic shielding fabric 1060 and the second zipper tape 1020 and the fourth second zipper tape 1040.

Figure 3:
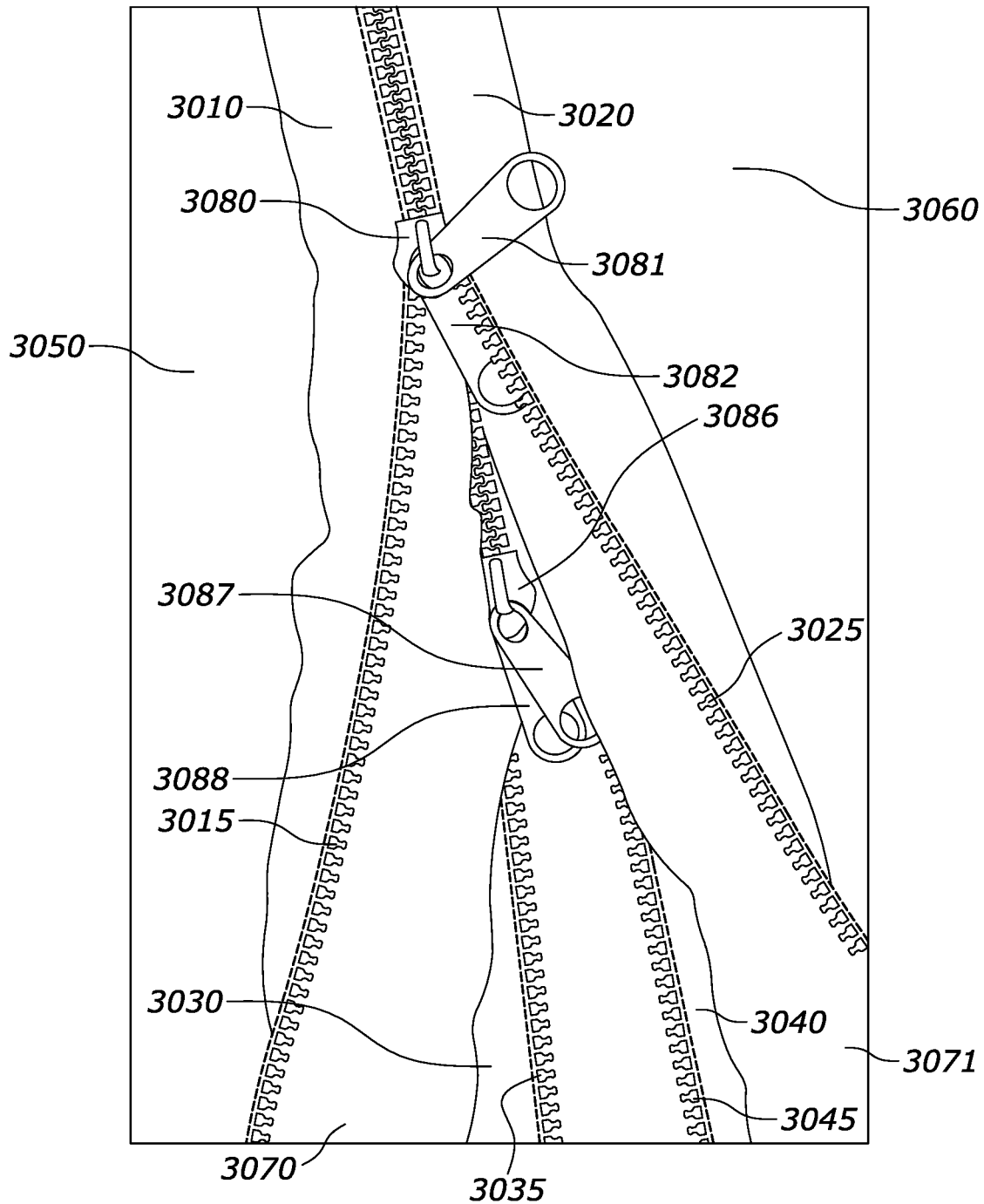
FIG. 3 shows a cutaway front view illustrating a close up of zippers and gaskets of the electromagnetically shielded enclosure according to embodiments of the present inventions.

FIG. 3 shows a cutaway front view illustrating a close up of zippers and gaskets of the electromagnetically shielded enclosure according to embodiments of the present inventions. A first zipper tape 3010 has a first row of a first plurality of teeth 3015. A second zipper tape 3020 has a second row of a second plurality of teeth 3025, the first plurality of teeth 3015 meshing with the second plurality of teeth 3025. A third zipper tape 3030 has a third row of a third plurality of teeth 3035. A fourth zipper tape 3040 has a fourth row of a fourth plurality of teeth 3045, the third plurality of teeth 3035 meshing with the fourth plurality of teeth 3045.

A first electromagnetic shielding fabric 3050 is fixedly coupled to the first zipper tape 3010 and the third zipper tape 3030. A second electromagnetic shielding fabric 3060 fixedly coupled to the second zipper tape 3030 and the fourth zipper tape 3040.

An elongated gasket 3070 is fixedly secured to the first electromagnetic shielding fabric 3050 in a positon between the first zipper tape 3010 and the third zipper tape 3030. Another elongated gasket 3071 is fixedly secured to the second electromagnetic shielding fabric 3060 in a positon between the second zipper tape 3020 and the fourth zipper tape 3040.

A first zipper traveler 3080 has a first pull 3081 and a third pull 3082 and joins the first plurality of teeth 3015 on the first zipper tape 3010 meshing with the second plurality of teeth 3025 on the second zipper tape 3020. A second zipper traveler 3086 has a second pull 3087 and a fourth pull 3088 and joins the third plurality of teeth 3035 meshing with the fourth plurality of teeth 3045.

Figure 4:
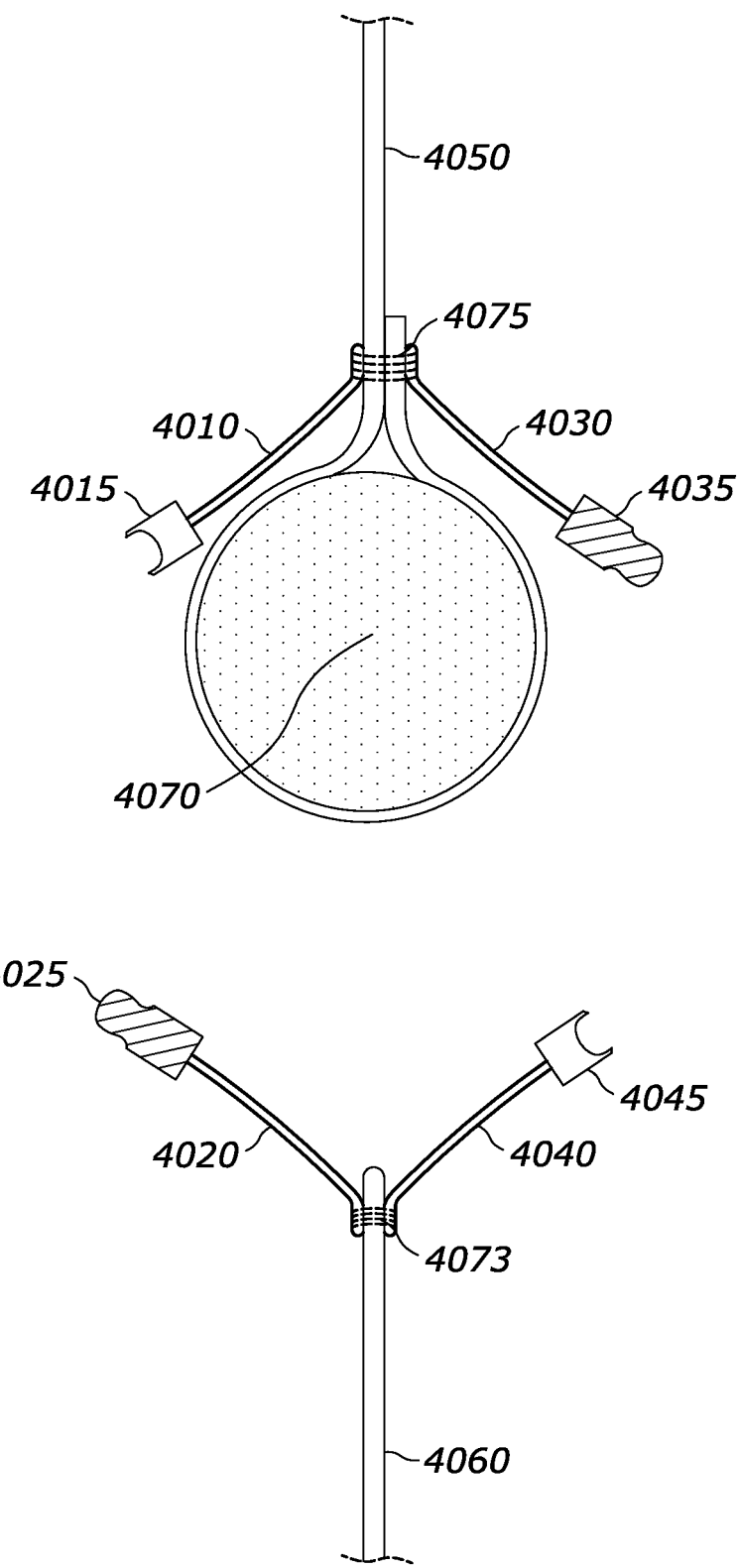
FIG. 4 illustrates an end view of an electromagnetic shielding zipper closure with two zippers and one gasket in an open position according to a first embodiment of the present inventions.

FIG. 4 illustrates an end view of an electromagnetic shielding zipper closure with two zippers and one gasket in an open position according to a first embodiment of the present inventions.

A first zipper tape 4010 has a first row of a first plurality of teeth 4015. A second zipper tape 4020 has a second row of a second plurality of teeth 4025, the first plurality of teeth meshing with the second plurality of teeth. A third zipper tape 4030 has a third row of a third plurality of teeth 4035. A fourth zipper tape 4040 has a fourth row of a fourth plurality of teeth 4045, the third plurality of teeth 4035 meshing with the fourth plurality of teeth 4045.

A first electromagnetic shielding fabric 4050 is fixedly coupled to the first zipper tape 4010 and the third zipper tape 4030. A second electromagnetic shielding fabric 4060 is fixedly coupled to the second zipper tape 4020 and the fourth zipper tape 4040.

An elongated gasket 4070 is fixedly secured to the first electromagnetic shielding fabric 4050 in a positon between the first zipper tape 4010 and the third zipper tape 4030. The elongated gasket 4070 is preferably a compressible foam in an elongated cylindrical shape. The elongated gasket 4070 is fixedly secured to the first electromagnetic shielding fabric 4050 by the first electromagnetic shielding fabric wrapped around the elongated gasket 4070. The first electromagnetic shielding fabric 4050 is wrapped around the elongated gasket 4070 has a stitch to itself 4075 to contain the elongated gasket. The stitch to itself 4075 can also stitch at least the first zipper tape 4010. The stitch to itself 4075 can also stitch at least the third zipper tape 4030.

Figure 5:
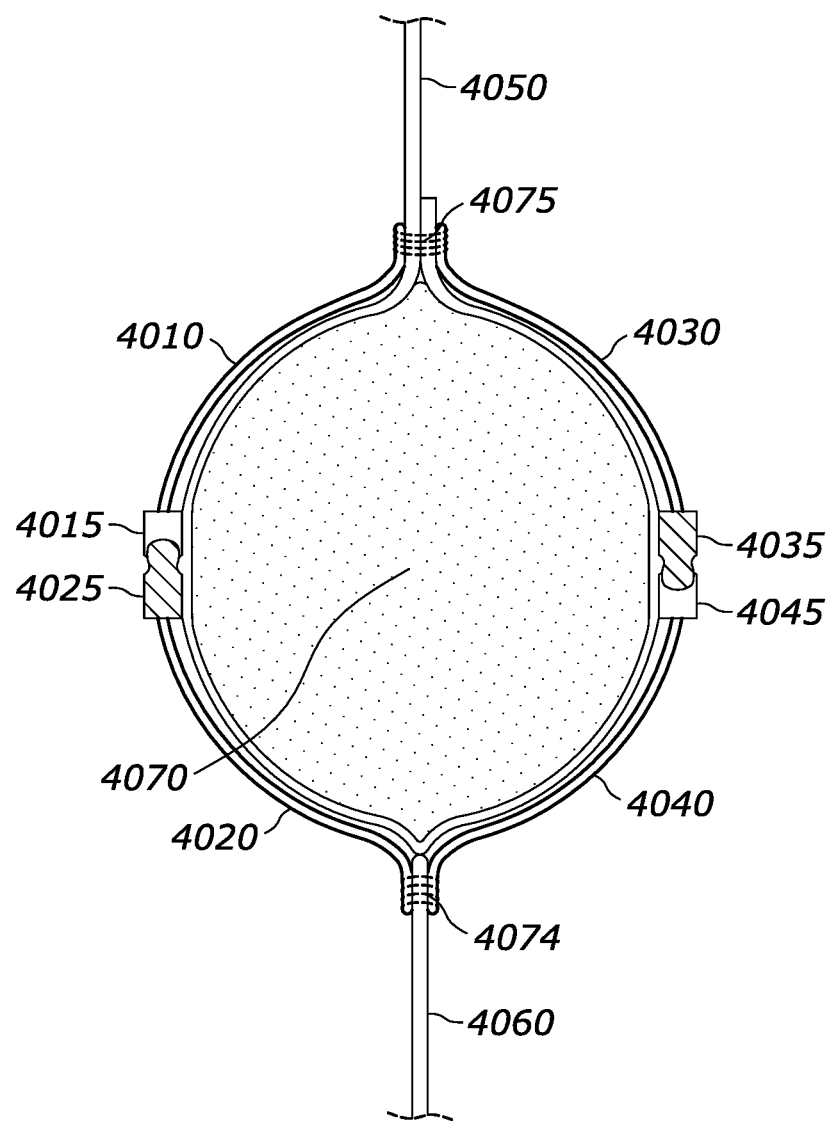
FIG. 5 illustrates an end view of an electromagnetic shielding zipper closure with two zippers and one gasket squeezed in a closed position according to the first embodiment of the present inventions.

FIG. 5 illustrates an end view of an electromagnetic shielding zipper closure with two zippers and one gasket squeezed in a closed position according to the first embodiment of the present inventions.

As illustrated in FIG. 5, an elongated gasket 4070 is held in a positon against a first zipper tape 4010 and a third zipper tape 4030 when the zippers are in a closed state. The zippers are in a closed state when a first plurality of teeth 4015 are meshed to securely join and connect with a second plurality of teeth 4025 and a third plurality of teeth 4035 are meshed to securely join and connect with a fourth plurality of teeth 4045.

A first zipper tape 4010 has a first row of a first plurality of teeth 4015. A second zipper tape 4020 has a second row of a second plurality of teeth 4025, the first plurality of teeth meshing with the second plurality of teeth. A third zipper tape 4030 has a third row of a third plurality of teeth 4035. A fourth zipper tape 4040 has a fourth row of a fourth plurality of teeth 4045, the third plurality of teeth 4035 meshing with the fourth plurality of teeth 4045.

A first electromagnetic shielding fabric 4050 is fixedly coupled to the first zipper tape 4010 and the third zipper tape 4030. A second electromagnetic shielding fabric 4060 is fixedly coupled to the second zipper tape 4020 and the fourth zipper tape 4040.

An elongated gasket 4070 is fixedly secured to the first electromagnetic shielding fabric 4050 in a positon between the first zipper tape 4010 and the third zipper tape 4030. The elongated gasket 4070 is preferably a compressible foam in an elongated cylindrical shape. The elongated gasket 4070 is fixedly secured to the first electromagnetic shielding fabric 4050 by the first electromagnetic shielding fabric wrapped around the elongated gasket 4070. The first electromagnetic shielding fabric 4050 is wrapped around the elongated gasket 4070 has a stitch to itself 4075 to contain the elongated gasket. The stitch to itself 4075 can also stitch at least the first zipper tape 4010. The stitch to itself 4075 can also stitch at least the third zipper tape 4030.

Figure 6:
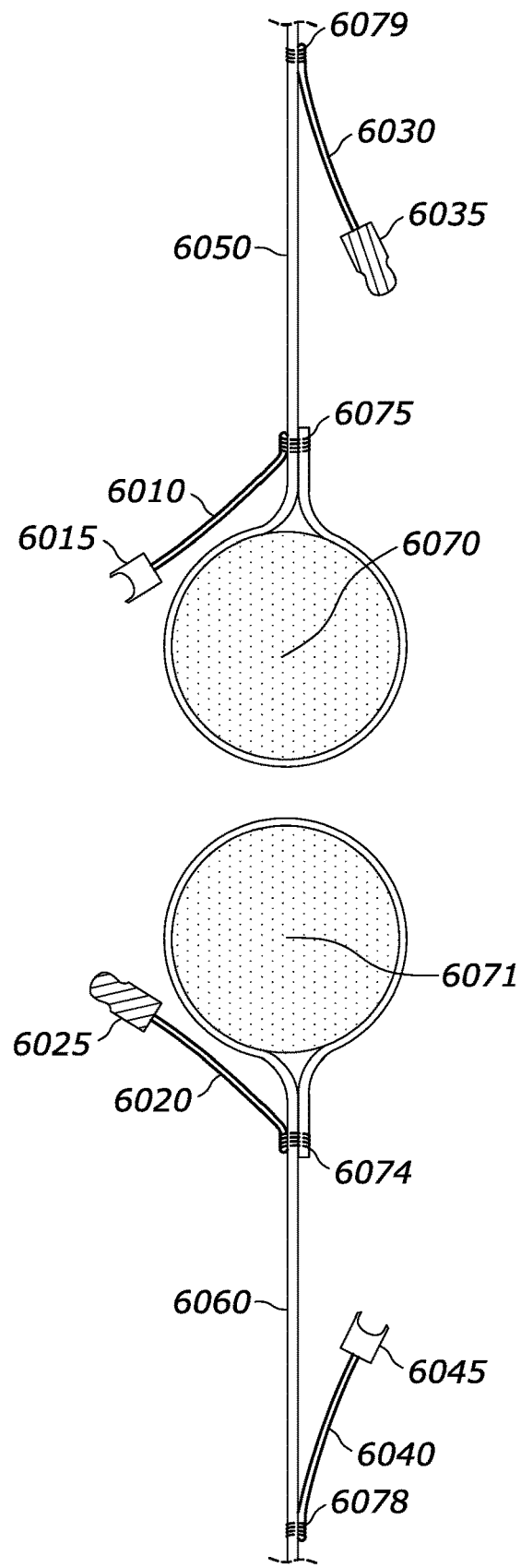
FIG. 6 illustrates an end view of an electromagnetic shielding zipper closure with two zippers and two gaskets in an open position according to a second embodiment of the present inventions.

FIG. 6 illustrates an end view of an electromagnetic shielding zipper closure with two zippers and two gaskets in an open position according to a second embodiment of the present inventions.

A first zipper tape 6010 has a first row of a first plurality of teeth 6015. A second zipper tape 6020 has a second row of a second plurality of teeth 6025, the first plurality of teeth meshing with the second plurality of teeth. A third zipper tape 6030 has a third row of a third plurality of teeth 6035. A fourth zipper tape 6040 has a fourth row of a fourth plurality of teeth 6045, the third plurality of teeth 6035 meshing with the fourth plurality of teeth 6045.

A first electromagnetic shielding fabric 6050 is fixedly coupled to the first zipper tape 6010 and the third zipper tape 6030. A second electromagnetic shielding fabric 6060 is fixedly coupled to the second zipper tape 6020 and the fourth zipper tape 6040.

An elongated gasket 6070 is fixedly secured to the first electromagnetic shielding fabric 6050 in a positon between the first zipper tape 6010 and the third zipper tape 6030. The elongated gasket 6070 is preferably a compressible foam in an elongated cylindrical shape. The elongated gasket 6070 is fixedly secured to the first electromagnetic shielding fabric 6050 by the first electromagnetic shielding fabric wrapped around the elongated gasket 6070. The first electromagnetic shielding fabric 6050 is wrapped around the elongated gasket 6070 has a stitch to itself 6075 to contain the elongated gasket. The stitch to itself 6075 can also stitch at least the first zipper tape 6010. The stitch to itself 6075 can also stitch at least the third zipper tape 6030.

Another stitch 6079 holds the third zipper tape 6030 to the first electromagnetic shielding fabric 6050 at a stich location different than the stitch to itself 6075.

Another elongated gasket 6071 fixedly secured to the second electromagnetic shielding fabric 6060 in a positon between the second zipper tape 6020 and the fourth zipper tape 6020. The another elongated gasket 6071 is fixedly secured to the second electromagnetic shielding fabric 6060 by the second electromagnetic shielding fabric wrapped around the another elongated gasket.

The first electromagnetic shielding fabric 6050 wrapped around the elongated gasket 6070 can have a stitch to itself 6075 to contain the elongated gasket. The second electromagnetic shielding fabric 6060 wrapped around the another elongated gasket 6071 can have another stitch to itself 6074 to contain the another elongated gasket. The stitch to itself 6075 can also stitch at least the first zipper tape 6010. The another stitch to itself 6074 can also stitches at least the second zipper tape 60200. The stitch to itself 6075 can also stitch at least the third zipper tape 6030. The another stitch to itself 6075 can also stitch at least the fourth zipper tape 6040.

Another stitch 6079 holds the third zipper tape 6030 to the first electromagnetic shielding fabric 6050 at a stich location different than the stitch to itself 6074 8074. A further another stitch 6078 holds the fourth zipper tape 6040 to the second electromagnetic shielding fabric 6060 at a stich location different than the another stitch to itself 6075.

Figure 7:
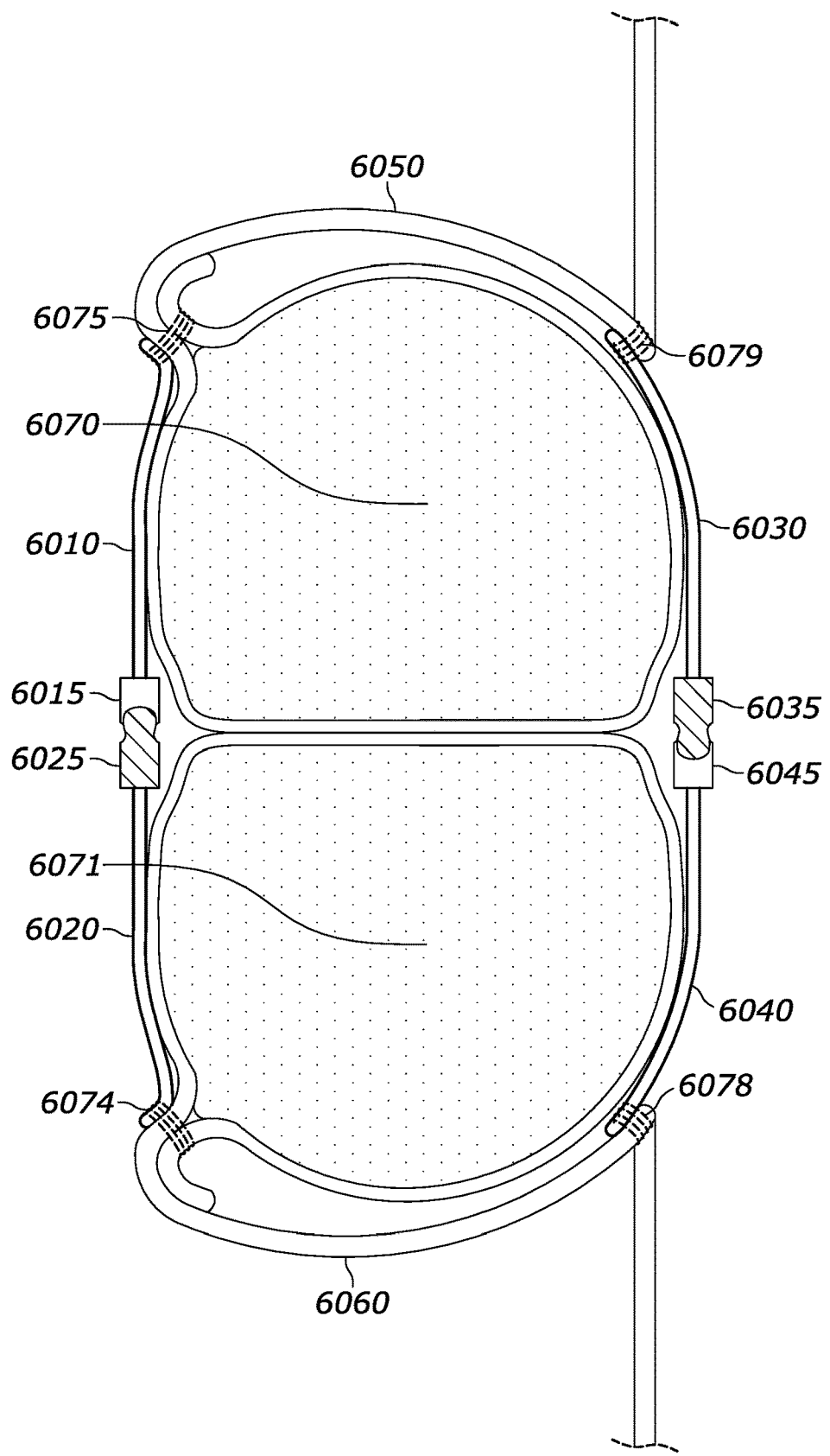
FIG. 7 illustrates an end view of an electromagnetic shielding zipper closure with two zippers and two gaskets squeezed in a closed position according to the second embodiment of the present inventions.

FIG. 7 illustrates an end view of an electromagnetic shielding zipper closure with two zippers and two gaskets squeezed in a closed position according to the second embodiment of the present inventions.

As illustrated in FIG. 7, an elongated gasket 6070 is held in a positon against a first zipper tape 6010 and a third zipper tape 6030 when the zippers are in a closed state. The zippers are in a closed state when a first plurality of teeth 6015 are meshed to securely join and connect with a second plurality of teeth 6025 and a third plurality of teeth 6035 are meshed to securely join and connect with a fourth plurality of teeth 6045.

A first zipper tape 6010 has a first row of a first plurality of teeth 6015. A second zipper tape 6020 has a second row of a second plurality of teeth 6025, the first plurality of teeth meshing with the second plurality of teeth. A third zipper tape 6030 has a third row of a third plurality of teeth 6035. A fourth zipper tape 6040 has a fourth row of a fourth plurality of teeth 6045, the third plurality of teeth 6035 meshing with the fourth plurality of teeth 6045.

A first electromagnetic shielding fabric 6050 is fixedly coupled to the first zipper tape 6010 and the third zipper tape 6030. A second electromagnetic shielding fabric 6060 is fixedly coupled to the second zipper tape 6020 and the fourth zipper tape 6040.

An elongated gasket 6070 is fixedly secured to the first electromagnetic shielding fabric 6050 in a positon between the first zipper tape 6010 and the third zipper tape 6030. The elongated gasket 6070 is preferably a compressible foam in an elongated cylindrical shape. The elongated gasket 6070 is fixedly secured to the first electromagnetic shielding fabric 6050 by the first electromagnetic shielding fabric wrapped around the elongated gasket 6070. The first electromagnetic shielding fabric 6050 is wrapped around the elongated gasket 6070 has a stitch to itself 6075 to contain the elongated gasket. The stitch to itself 6075 can also stitch at least the first zipper tape 6010. The stitch to itself 6075 can also stitch at least the third zipper tape 6030.

Another stitch 6079 holds the third zipper tape 6030 to the first electromagnetic shielding fabric 6050 at a stich location different than the stitch to itself 6075.

Another elongated gasket 6071 fixedly secured to the second electromagnetic shielding fabric 6060 held against the second zipper tape 6020 and the fourth zipper tape 6040 in a positon between the second zipper tape 6020 and the fourth zipper tape 6020. The another elongated gasket 6071 is fixedly secured to the second electromagnetic shielding fabric 6060 by the second electromagnetic shielding fabric wrapped around the another elongated gasket.

The first electromagnetic shielding fabric 6050 wrapped around the elongated gasket 6070 can have a stitch to itself 6075 to contain the elongated gasket. The second electromagnetic shielding fabric 6060 wrapped around the another elongated gasket 6071 can have another stitch to itself 6074 to contain the another elongated gasket. The stitch to itself 6075 can also stitch at least the first zipper tape 6010. The another stitch to itself 6074 can also stitches at least the second zipper tape 6020. The stitch to itself 6075 can also stitch at least the third zipper tape 4030. The another stitch to itself 6075 can also stitch at least the fourth zipper tape 4040 6040 8040.

Another stitch 6079 holds the third zipper tape 6030 to the first electromagnetic shielding fabric 6050 at a stich location different than the stitch to itself 6074. A further another stitch 6078 holds the fourth zipper tape 6040 to the second electromagnetic shielding fabric 6060 at a stich location different than the another stitch to itself 6075.

Figure 8:
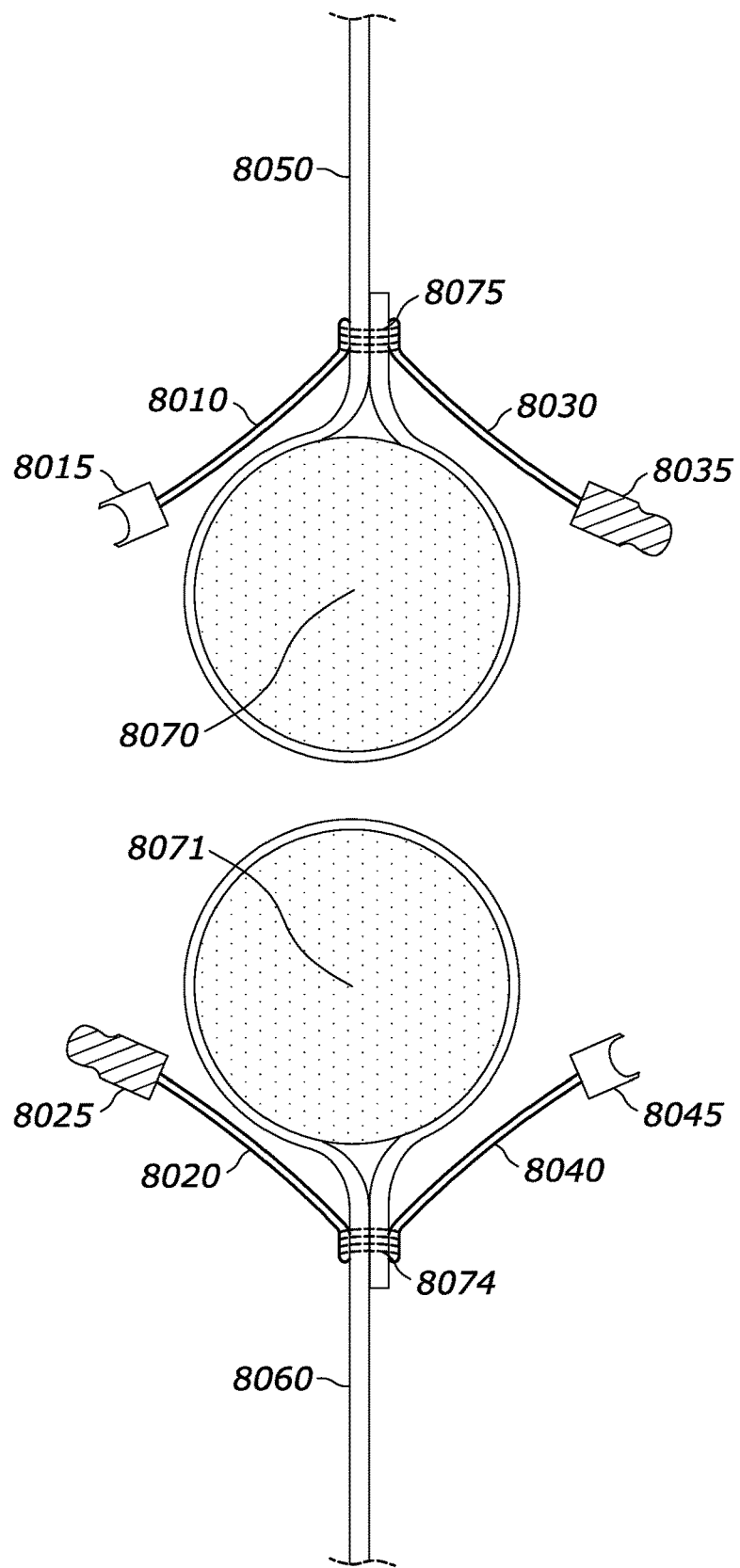
FIG. 8 illustrates an end view of an electromagnetic shielding zipper closure with two zippers and two gaskets in an open position according to a third embodiment of the present inventions.

FIG. 8 illustrates an end view of an electromagnetic shielding zipper closure with two zippers and two gaskets in an open position according to a third embodiment of the present inventions.

A first zipper tape 8010 has a first row of a first plurality of teeth 8015. A second zipper tape 8020 has a second row of a second plurality of teeth 8025, the first plurality of teeth meshing with the second plurality of teeth. A third zipper tape 8030 comprising a third row of a third plurality of teeth 8035. A fourth zipper tape 8040 comprising a fourth row of a fourth plurality of teeth 8045, the third plurality of teeth 8035 meshing with the fourth plurality of teeth 8045.

A first electromagnetic shielding fabric 8050 fixedly coupled to the first zipper tape 8010 and the third zipper tape 8030. A second electromagnetic shielding fabric 8060 fixedly coupled to the second zipper tape 8020 and the fourth zipper tape 8040.

An elongated gasket 8070 fixedly secured to the first electromagnetic shielding fabric 8050 in a positon between the first zipper tape 8010 and the third zipper tape 8030.

Another elongated gasket 8071 is fixedly secured to the second electromagnetic shielding fabric 8060 in a positon between the second zipper tape 8020 and the fourth zipper tape 8040.

The elongated gasket 8070 is fixedly secured to the first electromagnetic shielding fabric 8050, preferably by the first electromagnetic shielding fabric wrapped around the elongated gasket 8070. The another elongated gasket 8071 is fixedly secured to the second electromagnetic shielding fabric 8060, preferably by the second electromagnetic shielding fabric wrapped around the elongated gasket 8070.

The elongated gasket 8070 and the another elongated gasket 8071 are preferably compressible foam in an elongated cylindrical shape.

The elongated gasket 8070 is fixedly secured to the first electromagnetic shielding fabric 8050 by the first electromagnetic shielding fabric wrapped around the elongated gasket. The another elongated gasket 8071 is fixedly secured to the second electromagnetic shielding fabric 8060 by the second electromagnetic shielding fabric wrapped around the another elongated gasket.

The first electromagnetic shielding fabric 8050 wrapped around the elongated gasket 8070 can have a stitch to itself 8075 to contain the elongated gasket. The second electromagnetic shielding fabric 8060 wrapped around the another elongated gasket 8071 can have another stitch to itself 8074 to contain the another elongated gasket. The stitch to itself 8075 can also stitch at least the first zipper tape 8010. The another stitch to itself 8074 can also stitch at least the second zipper tape 8020. The stitch to itself 8075 can also stitch at least the third zipper tape 8030. The another stitch to itself 8075 can also stitch at least the fourth zipper tape 8040.

The stitch to itself 8075 can also stitch at least the first zipper tape 8010. The stitch to itself 8075 can also stitch at least the third zipper tape 8030. The another stitch to itself 8074 can also stitch at least the second zipper tape 8020. The stitch to itself 8075 can also stitch at least the third zipper tape 8030.

Figure 9:
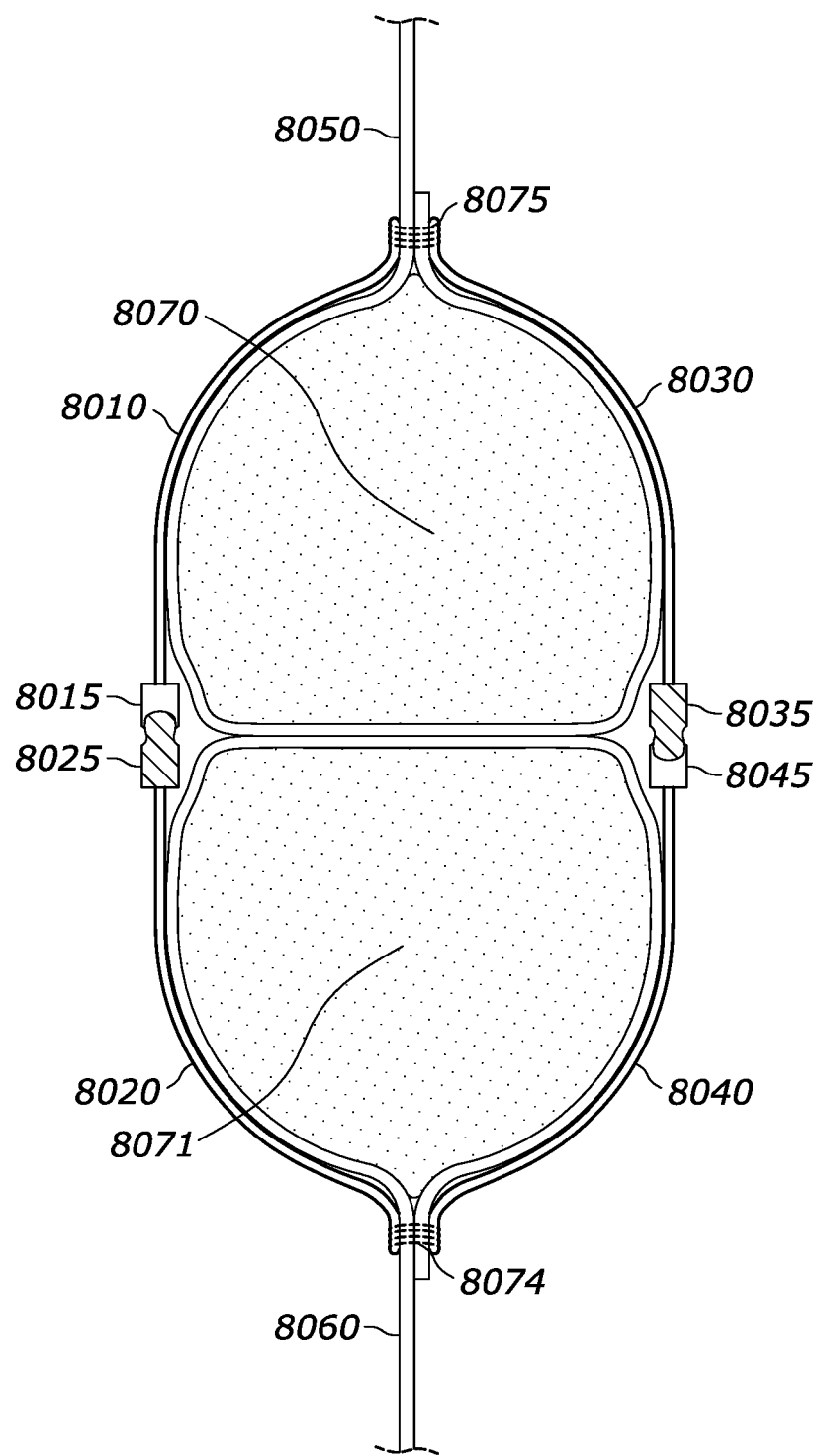
FIG. 9 illustrates an end view of an electromagnetic shielding zipper closure with two zippers and two gaskets squeezed in a closed position according to the third embodiment of the present inventions.

FIG. 9 illustrates an end view of an electromagnetic shielding zipper closure with two zippers and two gaskets squeezed in a closed position according to the third embodiment of the present inventions.

As illustrated in FIG. 9, an elongated gasket 8070 is held in a positon against a first zipper tape 8010 and a zipper tape 8030 when in a closed state. And an another elongated gasket 8071 fixedly secured to a second electromagnetic shielding fabric 8060 is held against a second zipper tape 8020 and a fourth zipper tape 8040 in a positon between the second zipper tape 8020 and the fourth zipper tape 8040 when in the closed state. The zippers are in a closed state when a first plurality of teeth 8015 are meshed to securely join and connect with a second plurality of teeth 8025 and a third plurality of teeth 8035 are meshed to securely join and connect with a fourth plurality of teeth 8045.

A first zipper tape 8010 has a first row of a first plurality of teeth 8015. A second zipper tape 8020 has a second row of a second plurality of teeth 8025, the first plurality of teeth meshing with the second plurality of teeth. A third zipper tape 8030 comprising a third row of a third plurality of teeth 8035. A fourth zipper tape 8040 comprising a fourth row of a fourth plurality of teeth 8045, the third plurality of teeth 8035 meshing with the fourth plurality of teeth 8045.

A first electromagnetic shielding fabric 8050 fixedly coupled to the first zipper tape 8010 and the third zipper tape 8030. A second electromagnetic shielding fabric 8060 fixedly coupled to the second zipper tape 8020 and the fourth zipper tape 8040.

An elongated gasket 8070 fixedly secured to the first electromagnetic shielding fabric 8050 in a positon between the first zipper tape 8010 and the third zipper tape 8030.

Another elongated gasket 8071 is fixedly secured to the second electromagnetic shielding fabric 8060 held against the second zipper tape 8020 and the fourth zipper tape 8040 in a positon between the second zipper tape 8020 and the fourth zipper tape 8040.

The elongated gasket 8070 is fixedly secured to the first electromagnetic shielding fabric 8050, preferably by the first electromagnetic shielding fabric wrapped around the elongated gasket 8070. The another elongated gasket 8071 is fixedly secured to the second electromagnetic shielding fabric 8060, preferably by the second electromagnetic shielding fabric wrapped around the elongated gasket 8070.

The elongated gasket 8070 and the another elongated gasket 8071 are preferably compressible foam in an elongated cylindrical shape.

The elongated gasket 8070 is fixedly secured to the first electromagnetic shielding fabric 8050 by the first electromagnetic shielding fabric wrapped around the elongated gasket. The another elongated gasket 8071 is fixedly secured to the second electromagnetic shielding fabric 8060 by the second electromagnetic shielding fabric wrapped around the another elongated gasket.

The first electromagnetic shielding fabric 8050 wrapped around the elongated gasket 8070 can have a stitch to itself 8075 to contain the elongated gasket. The second electromagnetic shielding fabric 8060 wrapped around the another elongated gasket 8071 can have another stitch to itself 8074 to contain the another elongated gasket. The stitch to itself 8075 can also stitch at least the first zipper tape 8010. The another stitch to itself 8074 can also stitch at least the second zipper tape 8020. The stitch to itself 8075 can also stitch at least the third zipper tape 8030. The another stitch to itself 8075 can also stitch at least the fourth zipper tape 8040.

The stitch to itself 8075 can also stitch at least the first zipper tape 8010. The stitch to itself 8075 can also stitch at least the third zipper tape 8030. The another stitch to itself 8074 can also stitch at least the second zipper tape 8020. The stitch to itself 8075 can also stitch at least the third zipper tape 8030.

Figure 10:
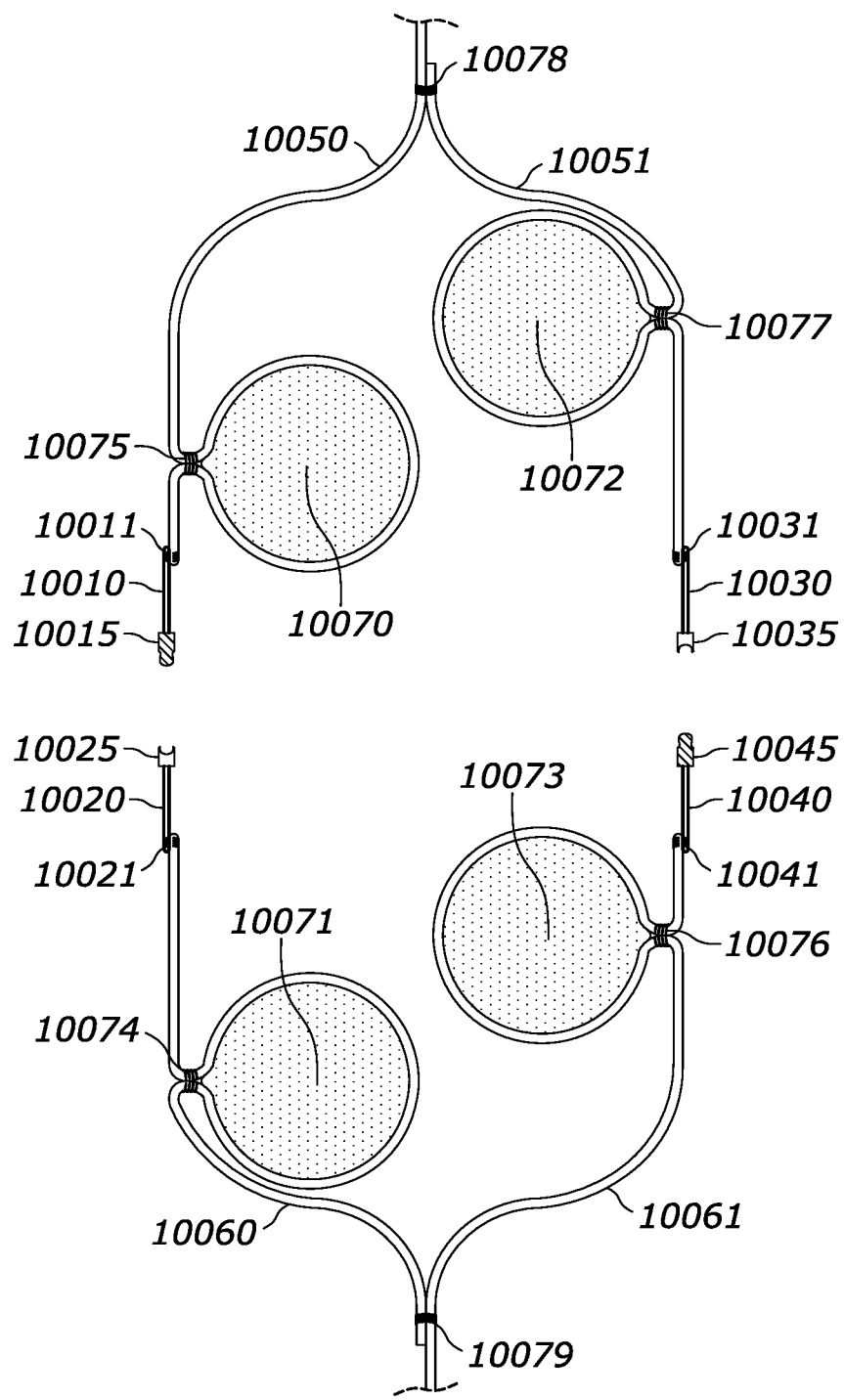
FIG. 10 illustrates an end view of an electromagnetic shielding zipper closure with two zippers and four gaskets in an open position according to a fourth embodiment of the present inventions.

FIG. 10 illustrates an end view of an electromagnetic shielding zipper closure with two zippers and four gaskets in an open position according to a fourth embodiment of the present inventions.

A first zipper tape 10010 has a first row of a first plurality of teeth 10015. A second zipper tape 10020 has a second row of a second plurality of teeth 10025, the first plurality of teeth meshing with the second plurality of teeth. A third zipper tape 10030 has a third row of a third plurality of teeth 10035. A fourth zipper tape 10040 has a fourth row of a fourth plurality of teeth 10045, the third plurality of teeth 10035 meshing with the fourth plurality of teeth 10045.

A first electromagnetic shielding fabric 10050 fixedly coupled to the first zipper tape 10010 and the third zipper tape 10030. A second electromagnetic shielding fabric 10060 fixedly coupled to the second zipper tape 10020 and the fourth zipper tape 10040.

An elongated gasket 10070 fixedly secured to the first electromagnetic shielding fabric 10050 in a positon between the first zipper tape 10010 and the third zipper tape 10030. The elongated gasket 10070 is fixedly secured to the first electromagnetic shielding fabric 10050 by the first electromagnetic shielding fabric wrapped around the elongated gasket 10070.

The elongated gasket 10070 can be fixedly secured to the first electromagnetic shielding fabric 10050 by the first electromagnetic shielding fabric wrapped around the elongated gasket. The first electromagnetic shielding fabric 10050 wrapped around the elongated gasket 10070 can have a stitch to itself 10075 to contain the elongated gasket.

Another elongated gasket 10073 is fixedly secured to the second electromagnetic shielding fabric 10060 in a positon between the second zipper tape 10020 and the fourth zipper tape 10040. The another elongated gasket 10073 can be fixedly secured to the second electromagnetic shielding fabric 10060 by the second electromagnetic shielding fabric wrapped around the another elongated gasket. The second electromagnetic shielding fabric 10060 wrapped around the another elongated gasket 10073 can have another stitch to itself 10074 to contain the another elongated gasket.

An extra elongated gasket 10072 is fixedly secured to an extra electromagnetic shielding fabric 10051 by the extra electromagnetic shielding fabric wrapped around the extra elongated gasket 10072. The extra electromagnetic shielding fabric 10051 can be wrapped around the extra elongated gasket 10072 and can have a stitch to itself 10077 to contain the extra elongated gasket 10072.

Another extra elongated gasket 10071 is fixedly secured to the second electromagnetic shielding fabric 10060 by the anther extra electromagnetic shielding fabric wrapped around the another extra elongated gasket 10071. The second electromagnetic shielding fabric 10060 can be wrapped around the extra elongated gasket 10071 and can have a stitch to itself 10074 to contain the extra elongated gasket 10074. In an alternate construction for the embodiment of FIGS. 10 and 11, the cut fabric portion can be reversed so 10060 is continuous on the left and 10061 is cut on the right and likewise the cut fabric portion so 10051 is continuous on the right and 10050 is cut on the left.

Figure 11:
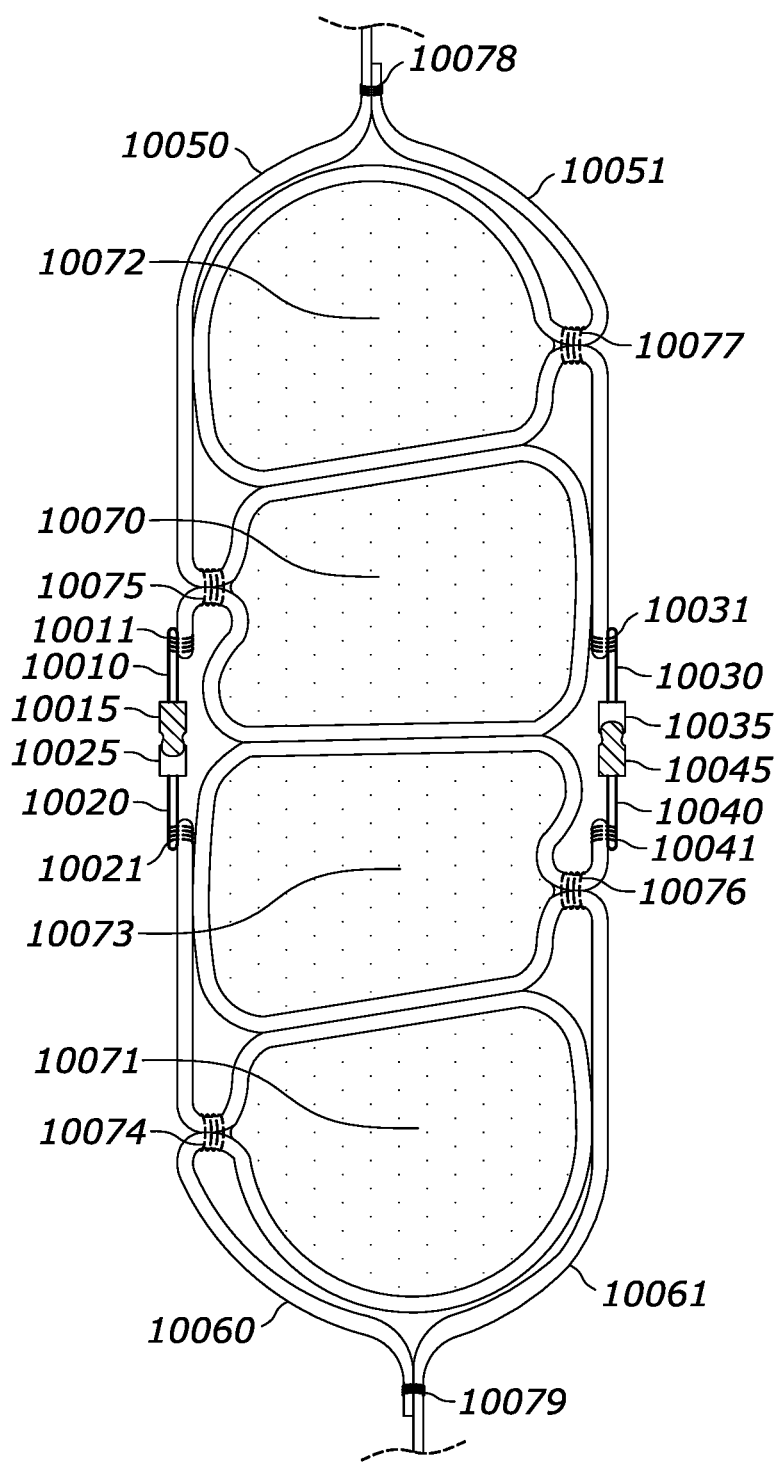
FIG. 11 illustrates an end view of an electromagnetic shielding zipper closure with two zippers and four gaskets interlinkingly squeezed together in a closed position according to the fourth embodiment of the present inventions.

In an alternate construction, the stitch to itself 10075 can also stitch at least the first zipper tape 10010, though not illustrated in FIG. 10 or 11. In an alternate construction, the stitch to itself 10077 can also stitch at least the third zipper tape 10030, though not illustrated in FIG. 10 or 11. In an alternate construction, the stitch to itself 10074 can also stitch at least the second zipper tape 10020, though not illustrated in FIG. 10 or 11. In an alternate construction, the stitch to itself 10076 can also stitch at least the fourth zipper tape 10040, though not illustrated in FIG. 10 or 11.

The elongated gasket 10070 and the another extra elongated gasket 10071 and the extra elongated gasket 10072 and the another elongated gasket 10073 are compressible foam in an elongated cylindrical shape.

While the embodiment of FIGS. 10 and 11 illustrates four alternatingly interlocking gaskets, three or five or six or more gaskets can be deployed to achieve an alternatingly interlocking configuration when the zippers are closed.

FIG. 11 illustrates an end view of an electromagnetic shielding zipper closure with two zippers and four gaskets, every other gasket interlinkingly squeezed together in a closed position according to the fourth embodiment of the present inventions.

As illustrated in FIG. 11, an elongated gasket 10070 and an another elongated gasket 10073 are held in a positon against one another when the zippers are closed. The zippers are in a closed state when a first plurality of teeth 10015 are meshed to securely join and connect with a second plurality of teeth 10025 and a third plurality of teeth 10035 are meshed to securely join and connect with a fourth plurality of teeth 10045.

As illustrated in FIG. 11, the elongated gasket 10070 can be held in a positon against a first zipper tape 10010 and the third zipper tape 10030 when the first plurality of teeth 10015 are meshed to securely join and connect with the second plurality of teeth 10025 and the third plurality of teeth 10035 are meshed to securely join and connect with the fourth plurality of teeth 10045.

As illustrated in FIG. 11, the another elongated gasket 10073 can be held against the second zipper tape 10020 and the fourth zipper tape 10040 in a positon between the second zipper tape 10020 and the fourth zipper tape 10040 when the zippers are closed. The zippers are in a closed state when the first plurality of teeth 10015 are meshed to securely join and connect with the second plurality of teeth 10025 and the third plurality of teeth 10035 are meshed to securely join and connect with the fourth plurality of teeth 10045.

A first zipper tape 10010 has a first row of a first plurality of teeth 10015. A second zipper tape 10020 has a second row of a second plurality of teeth 10025, the first plurality of teeth meshing with the second plurality of teeth. A third zipper tape 10030 has a third row of a third plurality of teeth 10035. A fourth zipper tape 10040 has a fourth row of a fourth plurality of teeth 10045, the third plurality of teeth 10035 meshing with the fourth plurality of teeth 10045.

A first electromagnetic shielding fabric 10050 fixedly coupled to the first zipper tape 10010 and the third zipper tape 10030. A second electromagnetic shielding fabric 10060 fixedly coupled to the second zipper tape 10020 and the fourth zipper tape 10040.

An elongated gasket 10070 fixedly secured to the first electromagnetic shielding fabric 10050 in a positon between the first zipper tape 10010 and the third zipper tape 10030. The elongated gasket 10070 can be fixedly secured to the first electromagnetic shielding fabric 10050 by the first electromagnetic shielding fabric wrapped around the elongated gasket 10070. The elongated gasket 10070 can be fixedly secured to the first electromagnetic shielding fabric 10050 by the first electromagnetic shielding fabric wrapped around the elongated gasket. The first electromagnetic shielding fabric 10050 wrapped around the elongated gasket 10070 can have a stitch to itself 10075 to contain the elongated gasket.

Another elongated gasket 10073 is fixedly secured to the second electromagnetic shielding fabric 10060 in a positon between the second zipper tape 10020 and the fourth zipper tape 10040. The another elongated gasket 10073 can be fixedly secured to the second electromagnetic shielding fabric 10060 by the second electromagnetic shielding fabric wrapped around the another elongated gasket. The second electromagnetic shielding fabric 10060 wrapped around the another elongated gasket 10073 can have another stitch to itself 10074 to contain the another elongated gasket.

An extra elongated gasket 10072 is fixedly secured to an extra electromagnetic shielding fabric 10051 by the extra electromagnetic shielding fabric wrapped around the extra elongated gasket 10072. The extra electromagnetic shielding fabric 10051 can be wrapped around the extra elongated gasket 10072 and can have a stitch to itself 10077 to contain the extra elongated gasket 10072.

Another extra elongated gasket 10071 is fixedly secured to the second electromagnetic shielding fabric 10060 by the anther extra electromagnetic shielding fabric wrapped around the another extra elongated gasket 10071. The second electromagnetic shielding fabric 10060 can be wrapped around the extra elongated gasket 10071 and can have a stitch to itself 10074 to contain the extra elongated gasket 10074. In an alternate construction for the embodiment of FIGS. 10 and 11, the cut fabric portion can be reversed so 10060 is continuous on the left and 10061 is cut on the right and likewise the cut fabric portion so 10051 is continuous on the right and 10050 is cut on the left.

The elongated gasket 10070 and the another extra elongated gasket 10071 and the extra elongated gasket 10072 and the another elongated gasket 10073 are compressible foam in an elongated cylindrical shape.

In an alternate construction, the stitch to itself 10075 can also stitch at least the first zipper tape 10010, though not illustrated in FIG. 10 or 11. In an alternate construction, the stitch to itself 10077 can also stitch at least the third zipper tape 10030, though not illustrated in FIG. 10 or 11. In an alternate construction, the stitch to itself 10074 can also stitch at least the second zipper tape 10020, though not illustrated in FIG. 10 or 11. In an alternate construction, the stitch to itself 10076 can also stitch at least the fourth zipper tape 10040, though not illustrated in FIG. 10 or 11.

While the embodiment of FIGS. 10 and 11 illustrates four alternatingly interlocking gaskets, three or five or six or more gaskets can be deployed to achieve an alternatingly interlocking configuration when the zippers are closed.

Figure 12:
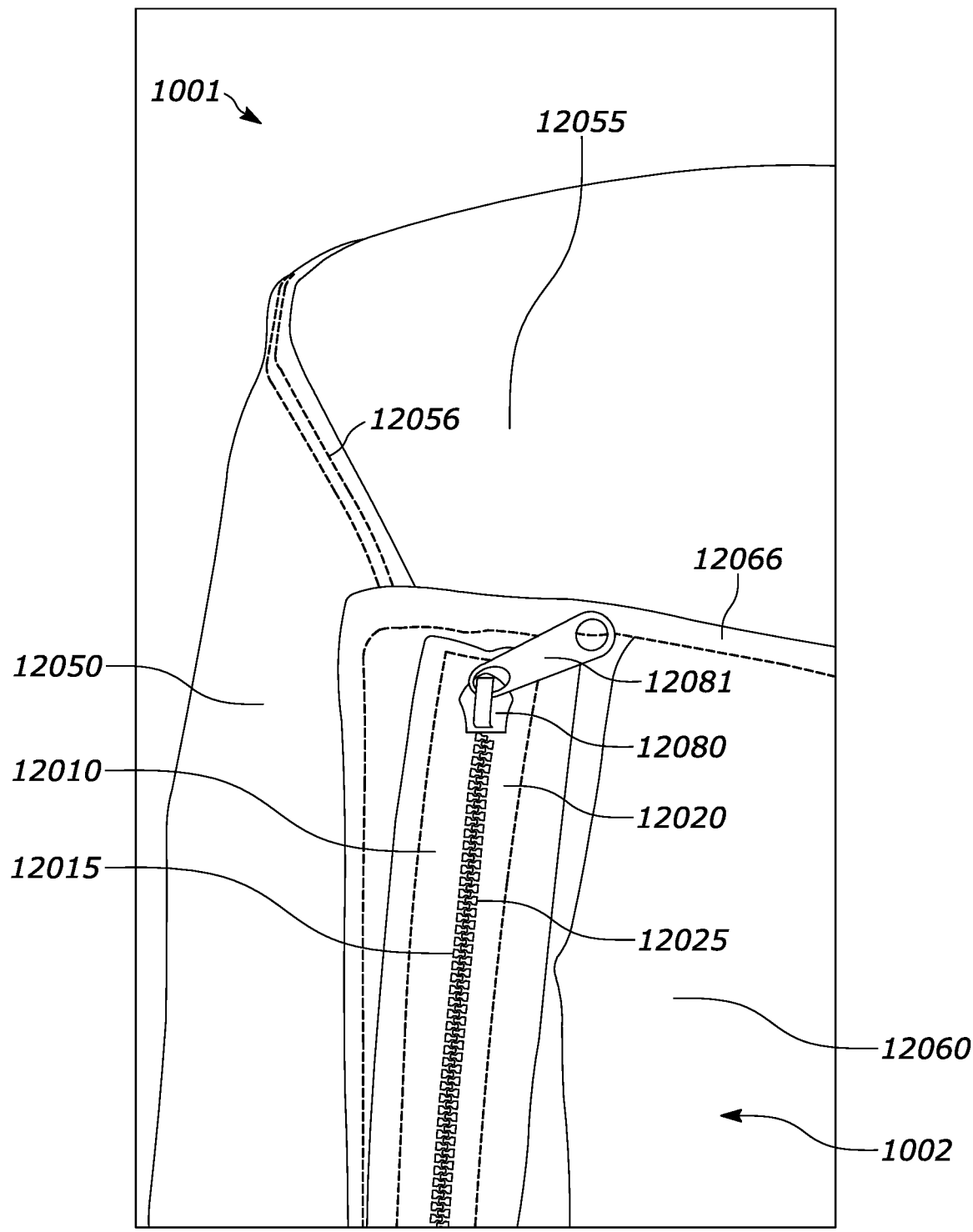
FIG. 12 shows a cutaway perspective view illustrating a close up of a zipper at and edge of the electromagnetically shielded enclosure according to embodiments of the present inventions.

FIG. 12 shows a cutaway perspective view illustrating a close up of a zipper at and edge of the electromagnetically shielded enclosure according to embodiments of the present inventions.

A first electromagnetic shielding fabric 12050 and a second electromagnetic shielding fabric 12060 are joined at a seam 12066 to form an electromagnetically shielded enclosure 1001.

A first zipper tape 12010 has a first row of a first plurality of teeth 12015. A second zipper tape 12020 has a second row of a second plurality of teeth 12025, the first plurality of teeth meshing with the second plurality of teeth.

The first electromagnetic shielding fabric 12050 (and 12055 with seam 12056) is fixedly coupled to the first zipper tape 12020. The second electromagnetic shielding fabric 12060 is fixedly coupled to the second zipper tape 12020.

The seams are preferably stitched with fabric folded to cover themselves and prevent leakage.

A first zipper traveler 12080 with a pull 12081 join the first plurality of teeth 12015 on first zipper tape 12010 meshing with the second plurality of teeth 12025 on second zipper tape 12020.

Figure 13:
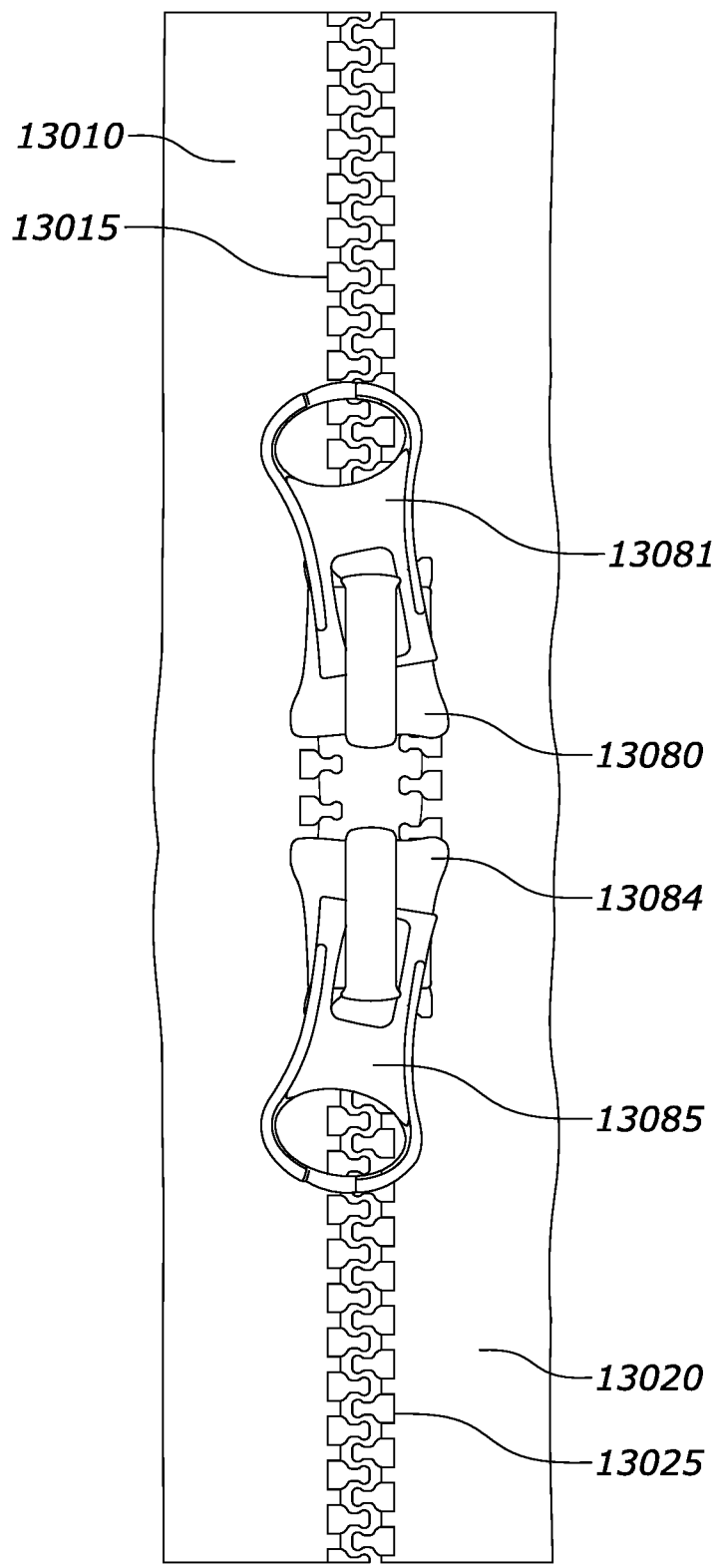
FIG. 13 illustrates a close front view up of a zipper with two opposing zipper travelers according to embodiments of the present inventions.

FIG. 13 illustrates a close front view up of a zipper with two opposing zipper travelers according to embodiments of the present inventions.

A first zipper traveler 13080 having a first pull 13081 join the first plurality of teeth 13015 on first zipper tape 13010 meshing with the second plurality of teeth 13025 on second zipper tape 13020.

Another zipper traveler 13084 with another first pull 13085 can join the first plurality of teeth 13015 on first zipper tape 13010 meshing with the second plurality of teeth 13025 on second zipper tape 13020, the another zipper traveler 13084 facing opposite the first zipper traveler 13080.

The zipper in any of the aforementioned embodiments can be any common zipper tape and zipper pull made from cotton or other material with plastic or metal teeth and pulls.

Any letter designations such as (a) or (b) etc. used to label steps of any of method claims herein are step headers applied for reading convenience and are not to be used in interpreting an order or process sequence of claimed method steps. Any method claims that recite a particular order or process sequence will do so using the words of their text, not the letter designations.

Unless stated otherwise, terms such as "first" and "second" are used to arbitrarily distinguish between the elements such terms describe. Thus, these terms are not necessarily intended to indicate temporal or other prioritization of such elements.

"Reference characters corresponding to elements recited in the detailed description and the drawings may be used in conjunction with the recitation of the same element or group of elements in the claims. The reference characters, however, should be enclosed within parentheses so as to avoid confusion with other numbers or characters which may appear in the claims. The use of reference characters is to be considered as having no effect on the scope of the claims." The Manual of Patent Examining Procedure (MPEP) issued by the United States Patent and Trademark Office, chapter 608.01(m) (Form of Claims).

Any trademarks listed herein are the property of their respective owners, and reference herein to such trademarks is generally intended to indicate the source of a particular product or service.

The abstract and the title are provided to comply with the rules requiring an abstract and a title that will allow a searcher or other reader to quickly ascertain the subject matter of the technical disclosure. It is submitted with the understanding that they will not be used to interpret or limit the scope or meaning of the claims. 37 CFR 1.72(b).

Although the inventions have been described and illustrated in the above description and drawings, it is understood that this description is by example only, and that numerous changes and modifications can be made by those skilled in the art without departing from the true spirit and scope of the inventions. Although the examples in the drawings depict only example constructions and embodiments, alternate embodiments are available given the teachings of the present patent disclosure.

What is claimed is:

1. An electromagnetic shielding zipper closure, comprising:
    a first zipper tape comprising a first row of a first plurality of teeth;
    a second zipper tape comprising a second row of a second plurality of teeth, the first plurality of teeth meshing with the second plurality of teeth;
    a third zipper tape comprising a third row of a third plurality of teeth;
    a fourth zipper tape comprising a fourth row of a fourth plurality of teeth, the third plurality of teeth meshing with the fourth plurality of teeth;
    a first electromagnetic shielding fabric with seam fixedly coupled to the first zipper tape and the third zipper tape;
    a second electromagnetic shielding fabric fixedly coupled to the second zipper tape and the fourth zipper tape; and
    an elongated gasket fixedly secured to the first electromagnetic shielding fabric in a positon between the first zipper tape and the third zipper tape.

2. An electromagnetic shielding zipper closure according to claim 1, wherein the elongated gasket is fixedly secured to the first electromagnetic shielding fabric by the first electromagnetic shielding fabric wrapped around the elongated gasket.

3. An electromagnetic shielding zipper closure according to claim 2, wherein the first electromagnetic shielding fabric wrapped around the elongated gasket has a stitch to itself to contain the elongated gasket.

4. An electromagnetic shielding zipper closure according to claim 3, wherein the stitch to itself also stitches at least the first zipper tape.

5. An electromagnetic shielding zipper closure according to claim 4, wherein the stitch to itself also stitches at least the third zipper tape.

6. An electromagnetic shielding zipper closure according to claim 4, wherein another stitch holds the third zipper tape to the first electromagnetic shielding fabric at a stich location different than the stitch to itself.

7. An electromagnetic shielding zipper closure according to claim 1, wherein the elongated gasket is compressible foam.

8. An electromagnetic shielding zipper closure according to claim 1,
    wherein a first zipper traveler comprising a first pull join the first plurality of teeth meshing with the second plurality of teeth; and
    wherein a second zipper traveler with second pull join the third plurality of teeth meshing with the fourth plurality of teeth.

9. An electromagnetic shielding zipper closure according to claim 8, wherein the elongated gasket is held in a positon against the first zipper tape and the third zipper tape when the first zipper traveler and the second zipper traveler are each slid into a closed zipper state.

10. An electromagnetic shielding zipper closure according to claim 1,
    wherein the first electromagnetic shielding fabric is fixedly coupled to the first zipper tape and the third zipper tape in a shape;
    wherein the second electromagnetic shielding fabric is fixedly coupled to the second zipper tape and the fourth zipper tape in the same shape to form an electromagnetic shielding fabric opening resembling a door or a window; and
    wherein the first electromagnetic shielding fabric and the second electromagnetic shielding fabric are joined to form an electromagnetically shielded enclosure.

11. An electromagnetic shielding zipper closure according to claim 1, further comprising another elongated gasket fixedly secured to the second electromagnetic shielding fabric in a positon between the second zipper tape and the fourth zipper tape.

12. An electromagnetic shielding zipper closure according to claim 11,
    wherein the elongated gasket is fixedly secured to the first electromagnetic shielding fabric by the first electromagnetic shielding fabric wrapped around the elongated gasket; and
    wherein the another elongated gasket is fixedly secured to the second electromagnetic shielding fabric by the second electromagnetic shielding fabric wrapped around the another elongated gasket.

13. An electromagnetic shielding zipper closure according to claim 12,
    wherein the first electromagnetic shielding fabric wrapped around the elongated gasket has a stitch to itself to contain the elongated gasket; and
    wherein the second electromagnetic shielding fabric wrapped around the another elongated gasket has another stitch to itself to contain the another elongated gasket.

14. An electromagnetic shielding zipper closure according to claim 13,
    wherein the stitch to itself also stitches at least the first zipper tape; and
    wherein the another stitch to itself also stitches at least the second zipper tape.

15. An electromagnetic shielding zipper closure according to claim 14,
    wherein the stitch to itself also stitches at least the third zipper tape; and
    wherein the another stitch to itself also stitches at least the fourth zipper tape.

16. An electromagnetic shielding zipper closure according to claim 14,
    wherein another stitch holds the third zipper tape to the first electromagnetic shielding fabric at a stich location different than the stitch to itself; and
    wherein a further another stitch holds the fourth zipper tape to the second electromagnetic shielding fabric at a stich location different than the another stitch to itself.

17. An electromagnetic shielding zipper closure according to claim 12,
    wherein an extra elongated gasket is fixedly secured to an extra electromagnetic shielding fabric by the extra electromagnetic shielding fabric wrapped around the extra elongated gasket; and
    wherein the extra electromagnetic shielding fabric wrapped around the extra elongated gasket has a stitch to itself to contain the extra elongated gasket.

18. An electromagnetic shielding zipper closure according to claim 17, wherein the extra stitch to itself also stitches at least the third zipper tape.

19. An electromagnetic shielding zipper closure according to claim 11, wherein an extra elongated gasket is fixedly secured to an extra electromagnetic shielding fabric by the extra electromagnetic shielding fabric wrapped around the extra elongated gasket.

20. An electromagnetic shielding zipper closure according to claim 11, wherein another extra elongated gasket is fixedly secured to the second electromagnetic shielding fabric by the anther extra electromagnetic shielding fabric wrapped around the another extra elongated gasket.

21. An electromagnetic shielding zipper closure according to claim 20, wherein the second electromagnetic shielding fabric wrapped around the extra elongated gasket has a stitch to itself to contain the extra elongated gasket.

22. An electromagnetic shielding zipper closure according to claim 11, wherein the elongated gasket and the another elongated gasket are compressible foam.

23. An electromagnetic shielding zipper closure according to claim 11,
    wherein a first zipper traveler comprising a first pull join the first plurality of teeth meshing with the second plurality of teeth; and
    wherein a second zipper traveler with second pull join the third plurality of teeth meshing with the fourth plurality of teeth.

24. An electromagnetic shielding zipper closure according to claim 23, wherein the elongated gasket and the another elongated gasket are held in a positon against one another when the first zipper traveler and the second zipper traveler are each slid into a closed zipper state.

25. An electromagnetic shielding zipper closure according to claim 23, wherein the elongated gasket and the another elongated gasket are held in a positon against the first zipper tape and the third zipper tape when the first zipper traveler and the second zipper traveler are each slid into a closed zipper state.

26. An electromagnetic shielding zipper closure according to claim 23, wherein the elongated gasket and the another elongated gasket are held in a positon one another and also against the first zipper tape and the third zipper tape when the first zipper traveler and the second zipper traveler are each slid into a closed zipper state.

27. An electromagnetic shielding zipper closure according to claim 11,
    wherein the first electromagnetic shielding fabric is fixedly coupled to the first zipper tape and the third zipper tape in a shape;
    wherein the second electromagnetic shielding fabric is fixedly coupled to the second zipper tape and the fourth zipper tape in the same shape to form an electromagnetic shielding fabric opening resembling a door or a window; and
    wherein the first electromagnetic shielding fabric and the second electromagnetic shielding fabric are joined to form an electrometrically shielded enclosure.

\* \* \* \* \*